United States Patent
Cheung et al.

(10) Patent No.: US 7,962,685 B2
(45) Date of Patent: Jun. 14, 2011

(54) PORTABLE DATA STORAGE DEVICE INCORPORATING MULTIPLE FLASH MEMORY UNITS

(75) Inventors: Tsz Kin Clifford Cheung, Singapore (SG); Teng Pin Poo, Singapore (SG); Henry Tan, Singapore (SG)

(73) Assignee: Trek 2000 International Ltd., Singapore (SG)

( * ) Notice: Subject to any disclaimer, the term of this patent is extended or adjusted under 35 U.S.C. 154(b) by 453 days.

(21) Appl. No.: 12/161,438

(22) PCT Filed: Dec. 13, 2006

(86) PCT No.: PCT/SG2006/000388
§ 371 (c)(1),
(2), (4) Date: Jul. 18, 2008

(87) PCT Pub. No.: WO2007/084079
PCT Pub. Date: Jul. 26, 2007

(65) Prior Publication Data
US 2009/0089486 A1    Apr. 2, 2009

(30) Foreign Application Priority Data

Jan. 18, 2006  (SG) ................. 200600513-6

(51) Int. Cl.
*G06F 12/00* (2006.01)
*G06F 13/00* (2006.01)
*G06F 13/28* (2006.01)
*G06F 9/26* (2006.01)
*G06F 9/34* (2006.01)

(52) U.S. Cl. ...................................... 711/103; 711/202

(58) Field of Classification Search .................. 711/103, 711/202
See application file for complete search history.

(56) References Cited

U.S. PATENT DOCUMENTS
7,676,626 B2 * 3/2010 Lee et al. ...................... 711/103
(Continued)

FOREIGN PATENT DOCUMENTS
DE    20022935    5/2002
(Continued)

OTHER PUBLICATIONS

Taehee Cho, et al, A Dual-Mode NAND Flash Memory: 1-Gb Multilevel and High-Performance 512-Mb Single-Level Modes, IEEE Journal of Solid-State Circuits, vol. 35, No. 11, Nov. 2001.
(Continued)

*Primary Examiner* — Jared I Rutz
*Assistant Examiner* — Ryan Bertram
(74) *Attorney, Agent, or Firm* — Ostrolenk Faber LLP

(57) ABSTRACT

A portable data storage device is disclosed which includes an Interface for enabling the portable data storage device to be used for data transfer with a host Computer, and an Interface controller for controlling the interface. There is also a master control unit for controlling the writing of data to and reading data from a non-volatile memory. The non-volatile memory includes at least one single layer cell flash memory and at least one multiple layer cell flash memory. Upon receiving a write instruction, the master control unit determines which of the memories data contained in the instruction should be written to, and writes the data as appropriate similarly, upon receiving a read instruction, the master control unit reads the data from the appropriate one of the memories and transmits the data out of the device.

7 Claims, 4 Drawing Sheets

U.S. PATENT DOCUMENTS

| | | | |
|---|---|---|---|
| 2005/0057995 A1 | 3/2005 | Mitani et al. | 365/222 |
| 2005/0138288 A1 | 6/2005 | Chou et al. | 711/115 |
| 2005/0223158 A1 | 10/2005 | See et al. | |
| 2008/0077728 A1* | 3/2008 | Kim et al. | 711/103 |
| 2008/0215800 A1* | 9/2008 | Lee et al. | 711/103 |

FOREIGN PATENT DOCUMENTS

| | | |
|---|---|---|
| DE | 20022935 U1 | 8/2002 |
| DE | 10 2005 020 796 A1 | 12/2005 |
| WO | WO 2004/112040 A2 | 12/2004 |

OTHER PUBLICATIONS

Notification Concerning Transmittal of International Preliminary Report on Patentability with mailing date of Jul. 31, 2008 for International Application No. PCT/SG2006/000388, International Preliminary Report on Patentability, and Written Opinion of the International Searching Authority (six pages).

European Search Report dated Aug. 5, 2009.

International Search Report dated Mar. 13, 2007, issued in coresponding PCT application No. PCT/SG2006/000388.

PCT Written Opinion of the International Searching Authority dated Mar. 13, 2007, issued in corresponding PCT Application No. PCT/SG2006/000388.

Abstract of Taehee, Cho et al.; "A Dual-Mode NAND Flash Memory: 1-Gb Multilevel and High-Performance 512-Mb Single-Level Modes"; (abstract) NPL/EPO [online]; Nov. 2001; [retrieved on Feb. 15, 2007]. IEEE Journal of Solidstate Circuits, IEEE Service Center, Piscataway, NJ, US; ISSN 0018-9200; vol. 36, Nr. 11. Retrieved from: EPOQUE NPL/EPO Database, pp. 1700 to 1706.

* cited by examiner

PORTABLE DATA STORAGE DEVICE INCORPORATING MULTIPLE FLASH MEMORY UNITS

CROSS REFERENCE TO RELATED APPLICATION

The present application is a 35 U.S.C. §§371 national phase conversion of PCT/SG2006/000388, filed 13 Dec. 2006, which claims priority of Singaporean Application No. 200600513-6, filed 18 Jan. 2006, the disclosure of which is incorporated herein by reference. The PCT International Application was published in the English language.

FIELD OF THE INVENTION

The present invention relates to a portable data storage device employing multiple flash memory units.

BACKGROUND OF INVENTION

In recent years it has become common to provide portable data storage devices having an internal flash memory. Such a device is disclosed in PCT/SG00/00029, entitled "Portable Data Storage Device". There a portable storage device is described having an integral USB plug which plugs into a USB socket of a computer (or other device). The portable data storage device includes a flash memory for storage of user data. The size of the memory in commercial versions of this device is typically at least 8 MB, but is often much higher. The overall size of the device is typically small enough that it fits into a closed fist.

Typically, commercial versions of this device employ NAND flash memory. NAND flash memory is available in two types: single layer cell ("SLC") flash memory, and multiple level cell ("MLC") flash memory. SLC presently has higher read/write speeds and longer lifetime, but MLC, which makes possible the storage of more than one (typically, two) bits per cell, is cheaper per bit stored.

SUMMARY OF THE INVENTION

The present invention aims to provide new and useful methods for storing and retrieving data from a portable data storage device incorporating a plurality of flash memory devices, and in particular it proposes that the flash memory devices comprise both SLC and MLC flash memory devices.

This makes it possible to provide a device which has a trade-off between the relative advantages of SLC and MLC. For example, if substantially half the memory of the device is provided by SLC, then the device has a speed which is about half way between that of SLC and that of MLC, while being cheaper than if the device were used MLC alone.

In principle, it would be possible to arrange for the portable data storage device to employ only the SLC initially (e.g. until the amount of data which the device has to store exceeds the capacity of the SLC), which would mean that initially the performance of the portable storage device would be as high as if the entire data storage function were realised using SLC. However, this leads to a rapid fall in performance as soon as the SLC is exhausted and the device has to start using the MLC. Accordingly, preferred embodiments of the present invention store data from the beginning using both the SLC and MLC.

In one form of the invention, the logical addresses (that is, addresses in commands sent to the portable data storage device by the host) are allocated such that the sequence of logical addresses corresponds to one or more blocks of SLC addresses, then to one or more block of MLC addresses, then to one of more blocks of SLC addresses, and so on. Thus, when a large amount of data (many blocks) is written to a sequence of logical addresses in the portable storage device, it will be written to both SLC memory and MLC memory. The sequence of logical addresses may in particular correspond alternately to a predefined number of blocks of SLC addresses and to a predefined number of blocks of MLC addresses.

For example, since in some realisations of MLC memories, the MLC blocks are twice as large as blocks of SLC memory, the sequence of logical addresses may correspond to two blocks of SLC, then one block of MLC, then two blocks of SLC, and so on. This would mean that a large amount of data will typically be written to equal amounts of SLC and MLC memory.

The correspondence between logical and physical memory addresses is given by a mapping table. In typical flash memory writing schemes this correspondence changes with time, as a respective succession of blocks of physical addresses become associated with each set of logical addresses under the control of a master control unit. However, the master control unit may be arranged to ensure that the mapping table is changed such that a given set of logical addresses is always associated with blocks of SLC memory, or always associated with blocks of MLC memory.

BRIEF DESCRIPTION OF THE FIGURES

Preferred features of the invention will now be described, for the sake of illustration only, with reference to the following figures in which.

DETAILED DESCRIPTION OF THE EMBODIMENTS

Figure 1:
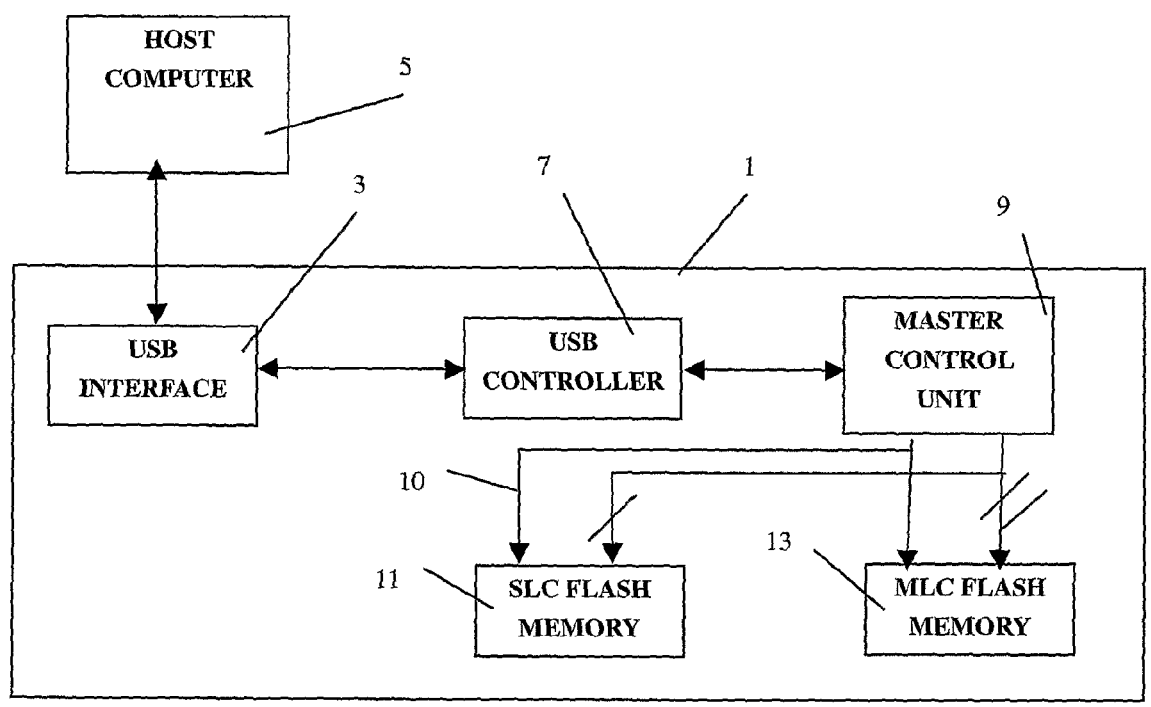
FIG. 1 is a schematic block diagram of an embodiment of the invention.

A portable data storage device which is an embodiment of the invention is shown schematically in FIG. 1. The portable storage device includes a housing 1 which has a USB interface 3. The USB interface may be electrically coupled to a serial bus (typically a USB socket) of an external device, such as a host computer 5. The USB interface 3 may be a USB plug integral with the housing 1, and for insertion into a socket of the host 5. Alternatively, in other embodiments, the USB interface 3 may be a socket for receiving a plug of a USB cable.

The portable storage device further includes a USB controller 7 which controls the USB interface 3. In use, the host 5 transfers data to and fro between itself and the portable data storage device. Data transferred to the USB interface 3 from host computer 5 passes through the USB controller 7 to a master control unit 9 in the form of data packets. Similarly, the interface controller 7 is arranged to send data it receives from the master control unit 9 through the interface 3. The data packets have sizes which are multiples of 512 bytes.

The master control unit 9 is connected to a bus 10, which may for example be an 8-bit bus. The bus 10 is further connected to an SLC-type NAND flash memory 11, and an MLC-type NAND flash memory 13. Each of these two memories may include one or more physically-separate integrated circuits. The memories 11, 13 are arranged in blocks of pages. Typically, a physical page of data consists of 2048 bytes.

Typically, a block of data in the SLC memory unit 11 consists of 64 pages and a block of data in MLC flash memory unit consists of 128 pages.

Additionally, the master control unit 9 is connected to each of the flash memories 11, 13 by a respective set of control lines 15. Each set of control lines transmits control signals referred to here as ENABLE, ALE, WRITE and READ signals.

When the master control unit 9 is to write data to memory, it enables one of the two memories 11, 13 by sending an ENABLE signal to it (thus, at most one of the two memories 11, 13 is enabled at any one time). At the same time, the master control unit 9 sends the enabled memory an ALE signal and WRITE signal. The master control unit 9 then writes address data and data to be stored to the enabled memory via 8-bit bus. The memory unit 11, 13 which is enabled stores the data in the location indicated by address data. The memory unit 11, 13 which is not enabled takes no action.

Similarly, when the memory control unit is to read data from one of the memories 11, 13, it enables that memory 11, 13 by using one of the control lines to send an ENABLE signal to that memory. It then uses the other control lines to send the enabled memory the ALE signal and the READ signal, and sends address data to the enabled memory using the 8-bit bus. The enabled memory 11, 13 transmits over the bus 10 the data at the physical location corresponding to the address data.

The algorithm performed by the embodiment will now be described. For simplicity we will assume that the SLC-type NAND flash memory unit 11 and MLC-type NAND flash memory unit 13 have different respective address mapping tables which respectively map physical addresses within the respective memories 11, 13 to logical addresses. These address mapping tables are typically stored in RAM (not shown) within the portable data storage device, and together constitute a single master mapping table.

In a typical example, data received from, or to be transmitted to, the host 3 is arranged in logical pages of size 512 bytes. However, as mentioned above, typically a physical page of data consists of 2048 bytes. Typically, a block of data in the SLC memory unit 11 consists of 64 pages and a block of data in MLC flash memory unit consists of 128 pages.

Figure 2A:
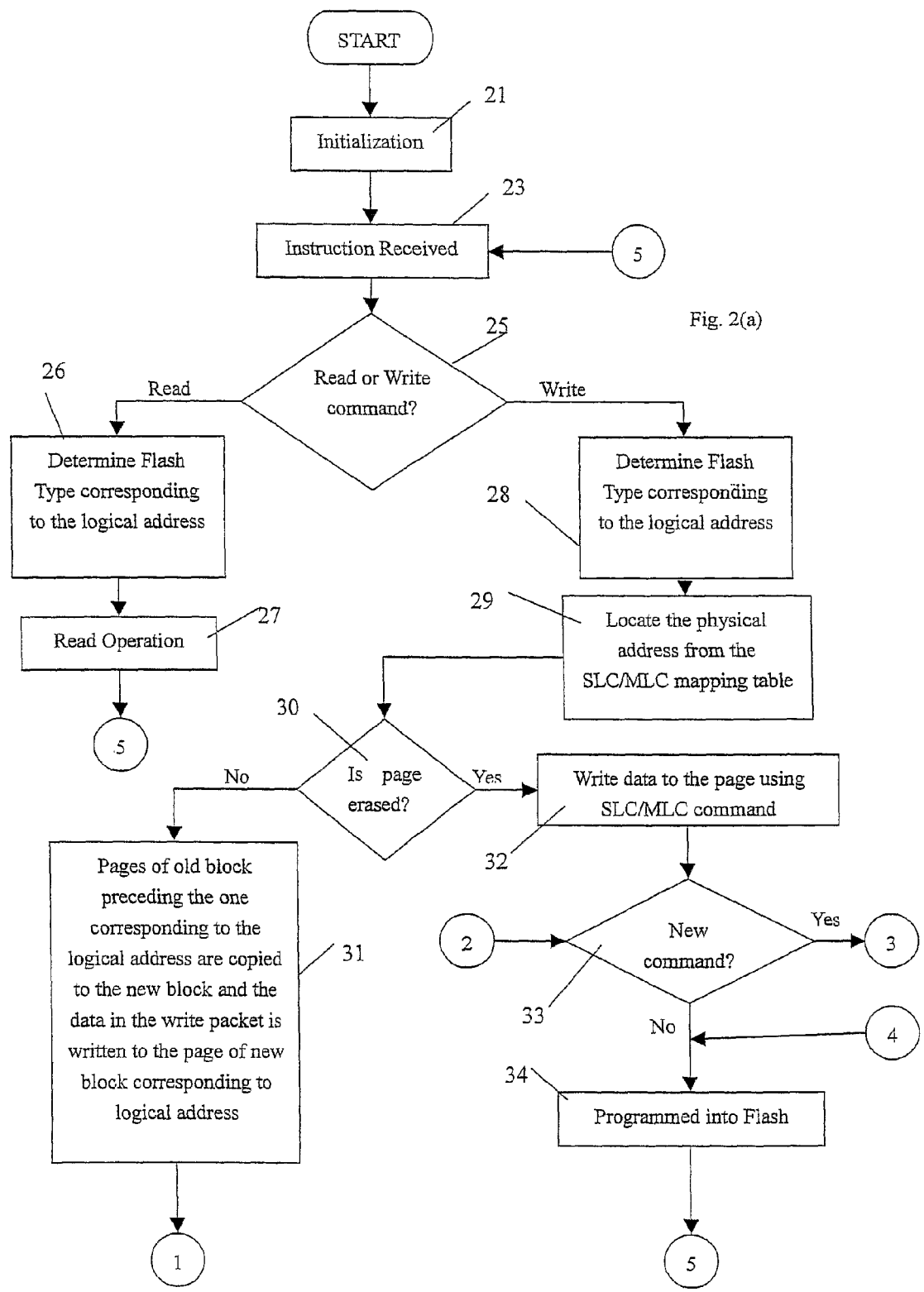
FIG. 2, which is composed of FIGS. 2(a), 2(b) and 2(c), is a flow diagram of the operation of the embodiment of FIG. 1.
Figure 2B:
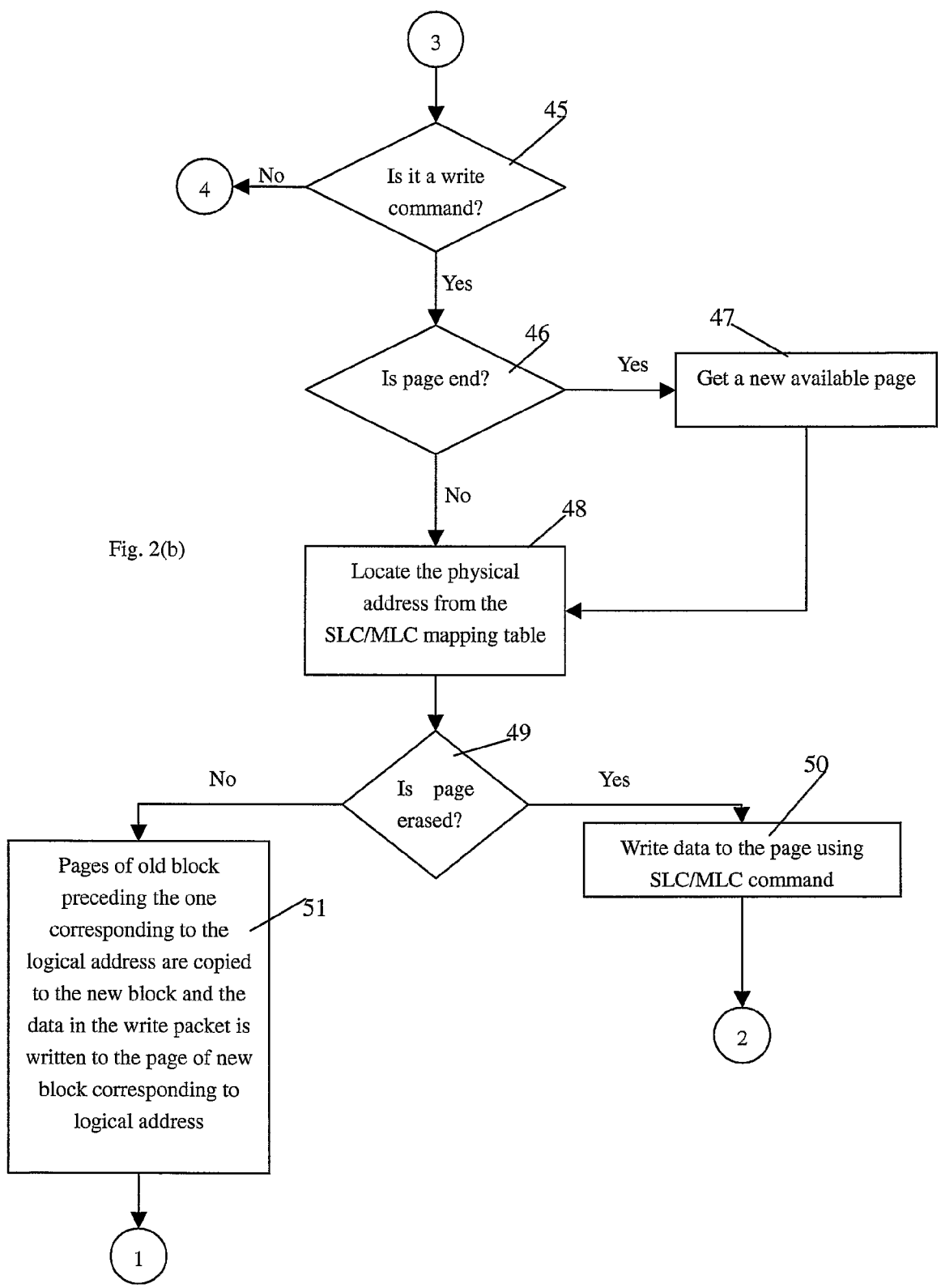
Figure 2C:
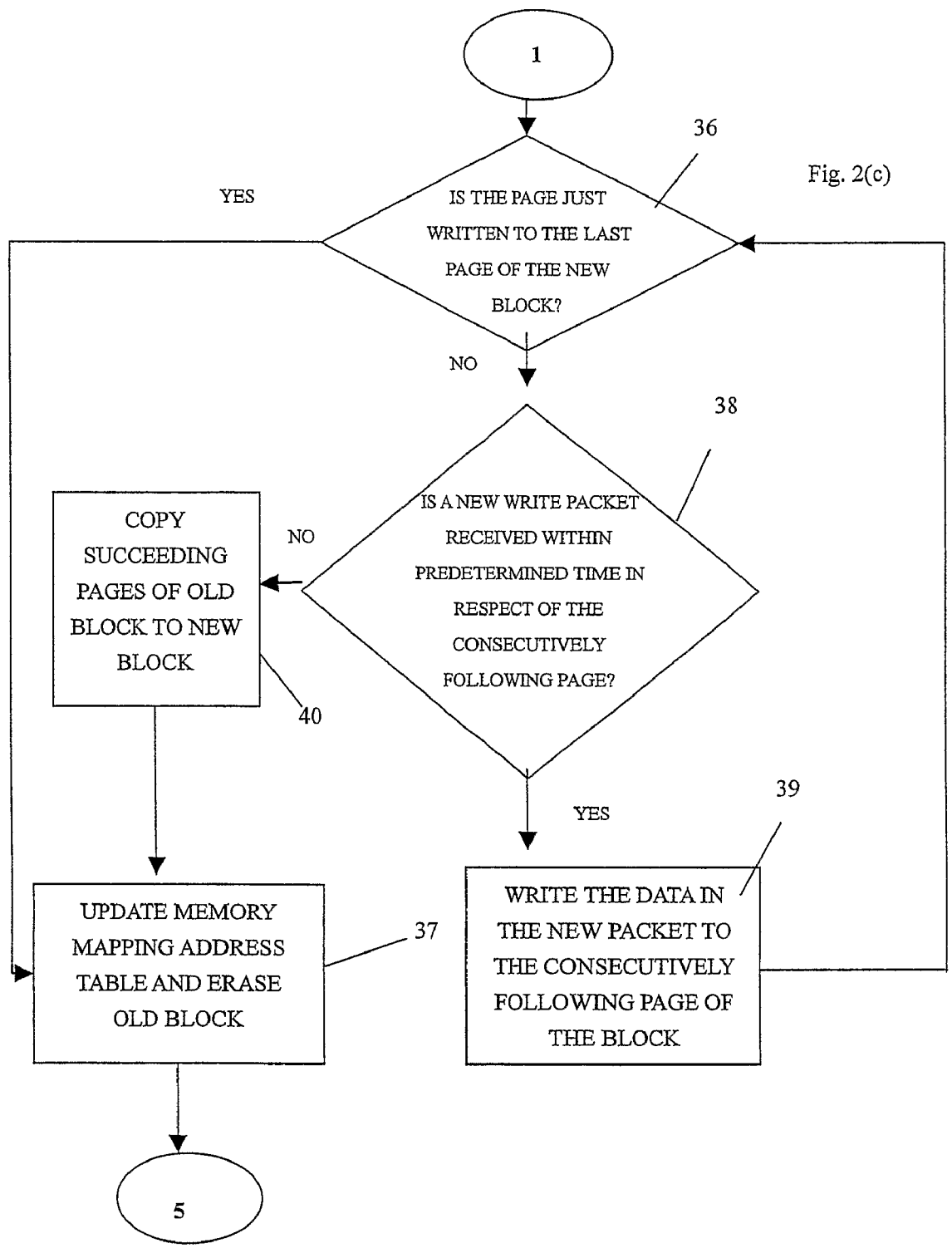

Referring to FIG. 2, and in particular FIG. 2(*a*), when portable data storage device is plugged into the host 3 an initialisation process begins (step 21), which initialises the master control unit 9 and USB controller unit 7, and in which the host 3 determines the ID of the flash and its location and capacity.

After the initialisation process, the master control unit 9 is ready to receive an instruction (data packet) from the host 3 (step 23). Once an instruction is received from the host 3, the master control unit 9 determines whether the packet received is a read packet or a write packet (step 25).

If the data packet is a read packet, the master control unit 9 performs a calculation (step 26), based on the logical address specified by the packet, to determine which of the memories 11, 13 corresponds to the logical address. It then reads the data from the determined memory 11, 13 at the address specified by the respective address mapping table (step 27), and the method then terminates until the next packet is received (this is represented in FIG. 2 as the box "5", which feeds back to the step 23).

If, alternatively, the data packet is a write packet, the master control unit 9 performs a calculation (step 28) to determine which memory 11, 13 to write the page 1 to.

After the type of NAND flash memory 11, 13 is selected, the master control unit 9 recalls the corresponding address mapping table from RAM (step 29), and uses it to locate the physical address corresponding to the logical address.

The master control unit then determines whether the page at that physical address is erased (step 30). If not, the master control unit performs an operation in which a new block is selected, pages of the old block preceding the page corresponding to the logical address are copied to the new block, and the data in the write packet is written to the page of new block corresponding to logical address (step 31).

The method then passes to the part of the flow diagram shown in FIG. 2(*c*). In step 36 it is determined whether the page just written to is the last page of the new block. If so, the memory mapping address table is updated and the old block is erased (step 37), and the method terminates. Conversely, if in step 36 the determination is negative, the method monitors whether another write packet in respect of the consecutively following page arrives within a predetermined interval (step 38). If so, then the data for that page is written to the same new block (step 39), and the method then passes back to step 36. If not, then in step 40 the master control unit 9 will copy the succeeding page of the old block to the new block and then pass to step 37 to update the mapping table and erase the old block. The method then again terminates.

Returning to FIG. 2(*a*), if in step 30 the determination is positive, then a write operation is performed (step 32) using an SLC or MLC command depending on what type of flash is being written into. In this operation, the master control unit 9 sends an ENABLE control signal to the selected NAND Flash memory 11, 13 to chip enable the NAND flash memory 11, 13 to prepare for a write operation. Then, the master control unit 9 sends data specifying the physical address in the NAND flash memory 11, 13 and the data to be written there.

After a page is written to the flash memory 11, 13, the master control unit 9 will monitor incoming write packets from the host 5 (step 33). If no write packet is received within a given time, then a step is performed of programming the written data into the flash (step 34). (The writing step 32 means the data is in the flash memory, but without the programming step 34 the data will lost if there is a power down. Following the programming step 34, the data will be able to survive a power down).

If however, at step 33 it is determined that a new packet has been received, the method passes to the part of the flow diagram shown in FIG. 2(*b*). In step 45 it is determined whether the new packet is a write packet. If not, the method passes back to step 34. Or, if so, the method determines (step 46) whether the write operation which was performed in step 32 was to the last part of the physical page. If so, in step 47 a new page is selected.

In any case, the corresponding physical address for the new write packet is determined from the appropriate address mapping table in step 48. In step 49 it is determined whether the page having this physical address is erased. If not, a step 51 is performed which is equivalent to step 31 of FIG. 2(*a*), and the method then passes to the steps of FIG. 2(*c*). Or, if so, a write operation (step 50) is performed (equivalent to that of step 32 of FIG. 2(*a*)), and the method passes back to step 33.

As described above, the master mapping table (i.e. the two address mapping tables) determines the mapping between logical addresses and physical addresses. As mentioned above, a large block of the SLC memory 11 typically has 64 pages, whereas a large block of the MLC memory 13 has 128 pages. In this case, the master mapping table is such that a sequence of logical addresses corresponds to two blocks of the SLC memory 11, then to one block of the MLC memory 13, then to two blocks of the SLC memory and so on. Thus, if data is written to the successive logical addresses, then the master control unit 9 enables the SLC flash memory 11 and sends a block of data to the memory 11, and then the master control unit 9 enables the MLC flash memory unit 13 and sends two blocks of data to the memory unit 13. This process is repeated until all the desired blocks of data have been sent to the respective flash memory units. In summary, i. If the data is being written to the SLC flash memory 11, the master control unit 9 will write two blocks into the SLC memory 11 before switching to the MLC memory 13.
ii. If the data is being written to the MLC memory 13, the master control unit 9 only writes one block. Upon determining that the page just written to is the last page of the block, the master control unit 9 will enable the SLC flash memory 11 for the next write operation.

When, in steps 31 and 51 a new physical block is associated with a set of logical addresses, this done such that if a given set of logical addresses previously corresponded to SLC memory then that continues to be true, and if the given set of logical addresses previously corresponded to MLC memory then that continues to be true. In other words, each of the address mapping tables is updated independently, without logical addresses being swapped between them.

Although only a single embodiment of the invention has been described in detail, many variations are possible within the scope of the claims, as will be clear to a skilled reader.

The invention claimed is:

1. A portable data storage device comprising:
    (a) an interface for enabling the portable data storage device to transfer data with a host computer;
    (b) an interface controller for controlling the interface;
    (c) a non-volatile memory comprising at least one single layer cell flash (SLC) memory and at least one multiple layer cell (MLC) flash memory; and
    (d) a master controller for controlling the writing of data to, and reading data from, the non-volatile memory, the master controller being operable:
    upon the interface receiving a write instruction from the host, to identify a flash memory from among said flash memories, and to write data specified by the write instruction to the identified flash memory, and
    upon the interface receiving a read instruction from the host, to identify the flash memory from among said flash memories, and to read data from the identified flash memory,
    wherein the master controller is operable to identify the flash memory based on a logical address contained in the instruction and with reference to a mapping table storing a sequence of logical addresses and a mapping between the logical addresses and physical addresses, such that in the sequence of logical addresses, SLC logical addresses alternate with MLC logical addresses, each SLC logical address corresponding to a predefined number of blocks of SLC addresses, and each MLC logical address corresponding to a predefined number of blocks of MLC addresses.

2. The device according to claim 1, wherein the single layer cell flash memory comprises a greater number of predefined blocks than does the multiple cell flash memory.

3. The device according to claim 2, wherein the single layer cell flash memory comprises two predefined blocks and the multiple layer cell flash memory comprises one memory block.

4. A method of storing data in a portable data storage device having comprising:
    (a) an interface for enabling the portable data storage device to transfer data with a host computer;
    (b) an interface controller for controlling the interface;
    (c) a non-volatile memory comprising at least one single layer cell flash (SLC) memory and at least one multiple layer cell (MLC) flash memory; and
    (d) a master controller for controlling the writing of data to, and reading data from, the non-volatile memory;
    the method comprising:
    (i) receiving a write instruction from the host,
    (ii) identifying a flash memory from among the said flash memories, and
    (iii) writing data specified by the write instruction to the identified flash memory
    wherein said step (ii) of identifying the flash memory includes extracting a logical address from the write instruction, and obtaining a physical address in the non-volatile memory from a mapping table storing a mapping between physical addresses and logical addresses, the logical addresses comprising a sequence of logical addresses such that SLC logical addresses alternate with MLC logical addresses, each SLC logical address corresponding to a predefined number of blocks of SLC addresses, and each MLC logical address corresponding to a predefined number of blocks of MLC addresses.

5. The method according to claim 4, wherein the single layer cell flash memory comprises a greater number of predefined blocks than does the multiple layer cell flash memory.

6. The method according to claim 5 wherein the single layer cell flash memory comprises two predefined blocks and the multiple layer cell flash memory comprises one memory block.

7. The method according to claim 4, wherein step (iii) of writing the data includes:
    determining whether the non-volatile memory having the obtained physical address is erased;
    when the determination is positive, writing said data to the obtained physical address; and
    when the determination is negative, allocating a new block to the logical address,
    wherein said obtained physical address and said allocated block are both single layer cell flash (SLC) memory or both multiple layer cell (MLC) flash memory.

* * * * *